(12) United States Patent
Masleid

(10) Patent No.: US 7,217,962 B1
(45) Date of Patent: May 15, 2007

(54) WIRE MESH PATTERNS FOR SEMICONDUCTOR DEVICES

(75) Inventor: Robert Paul Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 11/171,673

(22) Filed: Jun. 30, 2005

(51) Int. Cl.
*H01L 27/10* (2006.01)
*H01L 29/73* (2006.01)

(52) U.S. Cl. .................... 257/206; 257/202; 257/208; 257/E23.151

(58) Field of Classification Search .................... None
See application file for complete search history.

(56) References Cited

U.S. PATENT DOCUMENTS 6,936,898 B2 * 8/2005 Pelham et al. .............. 257/371

* cited by examiner

*Primary Examiner*—Minhloan Tran
*Assistant Examiner*—Leslie Pilar Cruz

(57) ABSTRACT

Different patterns of interconnects for connecting wells in a semiconductor device are described. For example, a semiconductor device may include n-wells and p-wells arrayed in rows and columns that lie on a rectilinear grid. Electrically conductive interconnects link at least some of the wells. The interconnects are arranged as a mesh having openings that are substantially rectangular in shape.

22 Claims, 5 Drawing Sheets

WIRE MESH PATTERNS FOR SEMICONDUCTOR DEVICES

BACKGROUND OF THE INVENTION

1. Field of the Invention

Embodiments of the present invention relate to semiconductor devices.

2. Related Art

In conventional very large scale integration (VLSI) semiconductor devices, the n-wells and p-wells are formed in rows and columns that lie parallel to the horizontal and vertical axes. A voltage can be routed to, for example, the n-wells using interconnecting conductive paths (such as deep n-well). Because the n-wells are arrayed on a grid, the interconnecting conductive paths (such as deep n-well) are also typically arranged as a grid.

A problem with a grid or grid-like pattern of conductive paths is that the interconnects frequently coincide with the locations of p-wells, preventing the passage of leads ("vias") that allow the p-wells to be connected to a substrate. That is, because both the p-wells and the interconnects lie in straight lines parallel to the horizontal and vertical axes, there can be many instances in which an interconnect lies under a row or column of p-wells.

One solution to the above problem is to rotate the grid-like pattern of interconnects so that they lie diagonally relative to the columns and rows of p-wells. However, while this solution can reduce the number of instances in which an interconnect lies under an entire row or column of p-wells, the X-shaped intersections of the interconnects still coincide frequently with locations of p-wells.

Another solution to the problems above is eliminate the X-shaped intersections by placing the interconnects along diagonals that run only in one direction (if the layout is viewed from above, then from the perspective of the viewer the interconnects run in parallel from, for example, the lower left to the upper right). However, this solution remains problematic because it sacrifices sheet resistance in the direction perpendicular to the diagonals. Furthermore, in instances where the n-wells are not large enough to bridge the distance between adjacent diagonals, a voltage will not be transported from one diagonal to the next.

SUMMARY OF THE INVENTION

Embodiments in accordance with the present invention pertain to different patterns of interconnects that address the problems described above.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Figure 1:
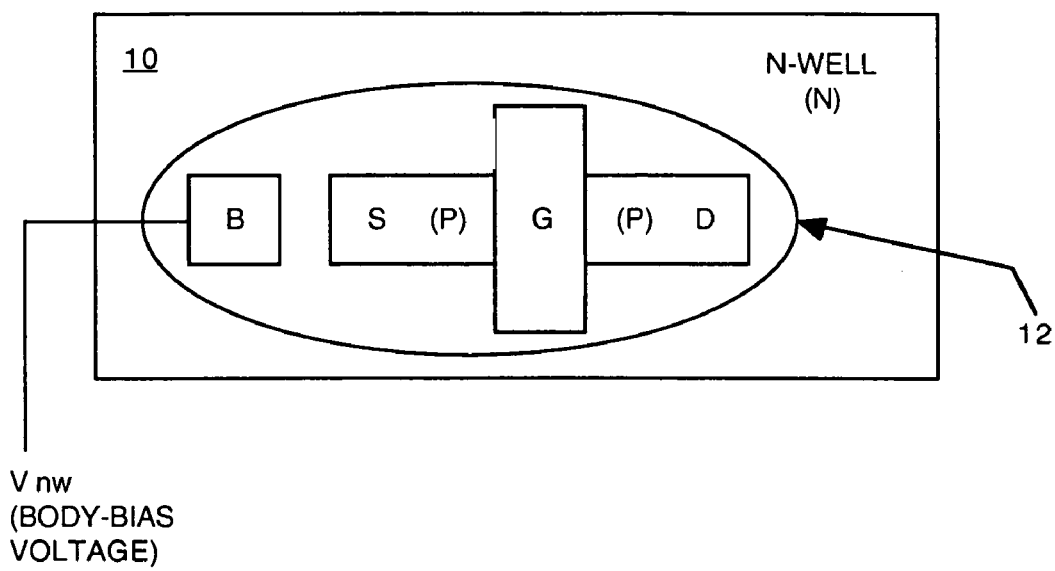
FIG. 1 is a block diagram of a top view of a positive-channel field effect transistor (pFET) formed in an n-well in one embodiment according to the present invention.

FIG. 1 illustrates a top view of a positive-channel field effect transistor (pFET) 12, or p-type metal-oxide semiconductor field effect transistors (p-type MOSFETs) pFET 12, formed in an n-well 10 when a p-type substrate and an n-20 well process are utilized in accordance with one embodiment of the present invention. The n-well 10 has an n-type doping. Various dopant concentrations may be utilized in different regions of the semiconductor device.

In the present embodiment, the pFET 12 has a body bias voltage Vnw applied to its bulk or body terminal B. As depicted in FIG. 1, the pFET 12 has gate G, drain D (p-type doping), source S (p-type doping), and bulk/body terminal B. In particular, the bulk/body terminal B is coupled to the n-well 10. Hence, a voltage applied to the bulk/body terminal B is received by the n-well 10. In the case of body biasing, the bulk/body terminal B receives a body bias voltage Vnw. Thus, the body bias voltage Vnw is applied to the n-well 10.

The pFET 12 is body biased to influence its performance. Without body biasing, the bulk/body terminal B is coupled to the circuit power supply. With body biasing, the circuit power supply and bulk/body terminal B are not coupled together. Instead, bulk/body terminal B is connected to a second, independent power supply. Body biasing enables the potential difference between the bulk/body terminal B and the transistor terminals S, G and D of the pFET 12 to be controlled, thereby providing the ability to control the threshold voltage level of the pFET 12. Other parameters, such as the leakage current associated with pFET 12, can also thereby be controlled. Increasing threshold voltage decreases leakage current. Thus, body biasing to increase threshold voltage can be used to decrease leakage current.

While the discussion above describes coupling a body bias voltage to pFETs or p-type MOSFETs formed in surface n-wells, embodiments in accordance with the present invention are equally applicable to coupling a body bias voltage to negative-channel FETs (nFETs) or n-type MOSFETS formed in surface p-wells via a conductive sub-surface region of p-type doping when an n-type substrate and a p-well process are utilized. Consequently, embodiments in accordance with the present invention are well suited to semiconductors formed with and in either p-type or n-type materials.

Figure 2:
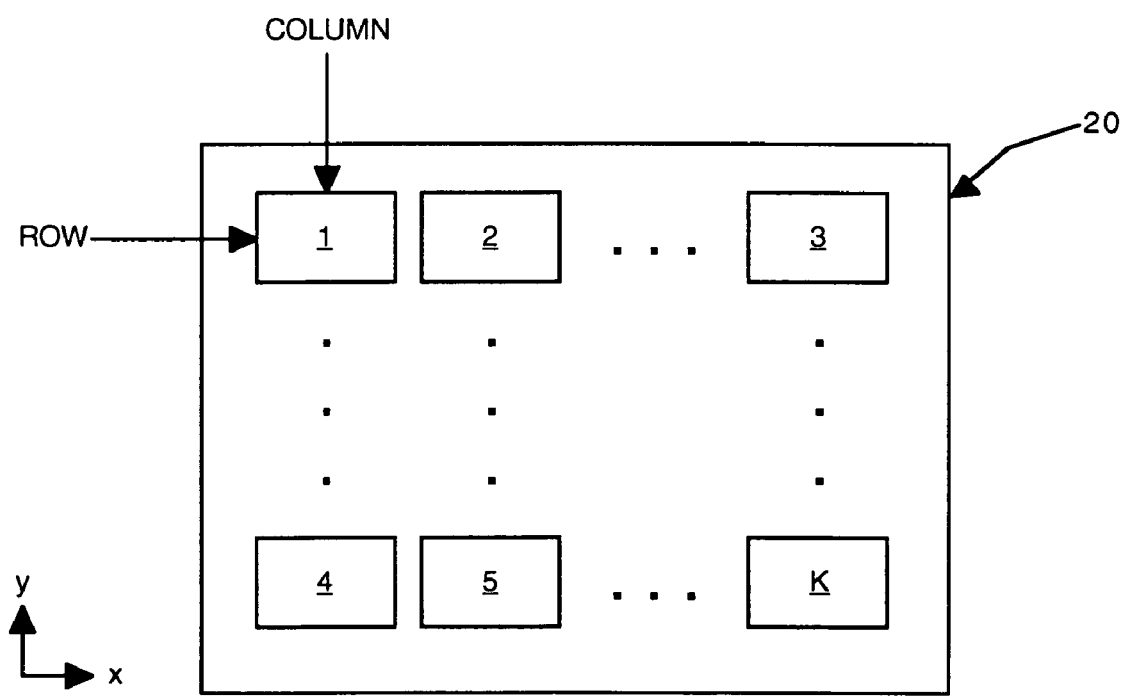
FIG. 2 is a block diagram showing n-wells and p-wells arrayed in rows and columns in a semiconductor device in one embodiment according to the present invention.

FIG. 2 is a block diagram showing wells 1, 2, 3, 4, 5, ..., K (1–K) arrayed in a semiconductor device 20 in one embodiment according to the present invention. Each of the elements 1–K can represent either an n-well or a p-well. Virtually any arrangement of n-wells and p-wells is possible. For example, n-wells and p-wells may alternate in a checkerboard pattern, or rows (or columns) of n-wells may alternate with rows (or columns) of p-wells. The elements 1–K are only representations of n-wells and p-wells and are not intended to imply that the n-wells and p-wells have a particular shape or relative size.

In the example of FIG. 2, device 20 utilizes a type of layout compatible with VLSI designs and design techniques, in which the n-wells and p-wells 1–K are arranged in a grid, with rows that are parallel to the x-axis and columns that are parallel to the y-axis. The grid may or may not be uniform and may or may not be fully occupied.

FIGS. 3, 4, 5, 6 and 7 illustrate patterns of interconnects for interconnecting n-wells or p-wells in a semiconductor device in embodiments according to the present invention. The patterns of interconnects may be referred to herein as a "mesh." For simplicity of discussion, the geometric elements of a mesh may be referred to herein as "tiles." In one embodiment, the interconnects have a uniform wire width.

In one embodiment, the interconnects of the various mesh patterns make electrical contact with n-wells, and the openings between interconnects correspond to locations of p-wells. In one such embodiment, the interconnects are used for distributing a bias voltage to the n-wells, as described above in conjunction with FIG. 1.

The meshes of FIGS. 3–7 can be envisioned as underlying the semiconductor device 20 of FIG. 2 (recognizing that the scale of FIG. 2 is different than the scales of FIGS. 3–7), such that the interconnects provide an electrical connection between n-wells and such that the openings underlie locations of p-wells. For example, column 32 may correspond to a column of device 20 and row 33 may correspond to a row of device 20. The lengths of the interconnects (and hence the size of the openings), as well as the arrangement of the tiles, can be selected so that the interconnects make electrical contact with n-wells in column 32 and with n-wells in row 33, while the openings align with p-wells in column 32 and with p-wells in row 33.

Figure 3:
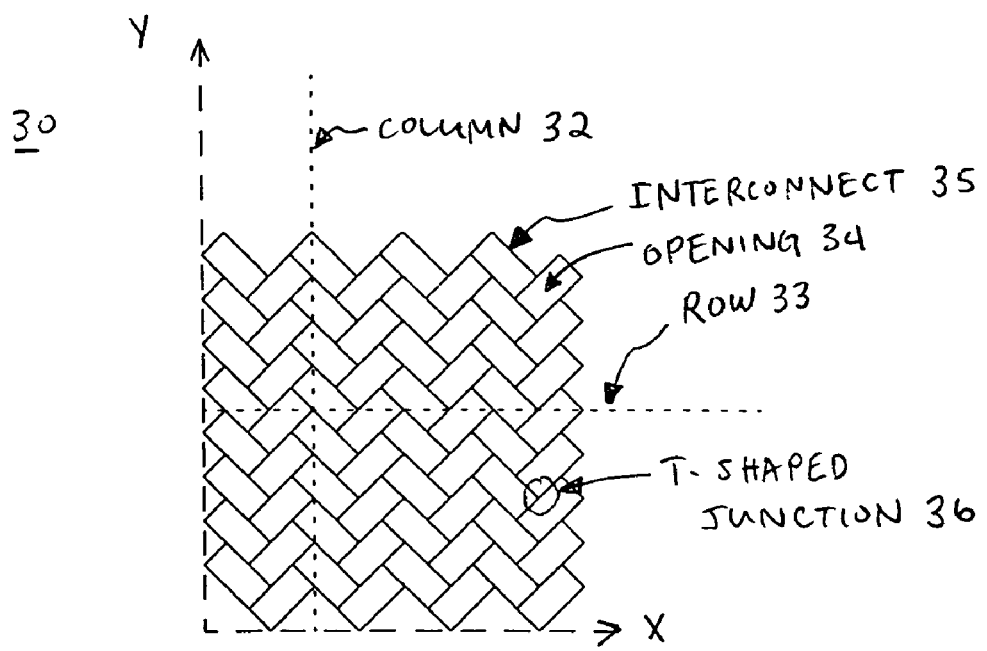
FIGS. 3, 4, 5, 6 and 7 illustrate patterns for interconnecting wells in a semiconductor device in embodiments according to the present invention.

With reference first to FIG. 3, the interconnects—exemplified by interconnect 35—form a mesh 30. In mesh 30, the junctions formed where interconnects meet (exemplified by junction 36) are T-shaped.

The mesh 30 includes a number of openings, exemplified by opening (or tile) 34. In one embodiment, the openings (or tiles) are rectangular in shape. While described as rectangular, some deviation from a rectangle shape—for example, deviations introduced by manufacturing tolerances—is permitted so that the openings or tiles are substantially rectangular in shape.

In general, as will be seen, the dimensions of the tiles can be selected to be integer multipliers of a unit of measurement, thus facilitating compatibility with VLSI design. In one particular embodiment, the length of rectangular tile 34 is twice its width.

In the example of FIG. 3, the openings (or tiles) have a uniform size. Accordingly, each pair of adjacent, parallel interconnects is separated by a uniform distance.

As can be seen by FIG. 3, relative to the x- and y-axes, some of the rectangles are skewed or rotated in one direction while other rectangles are skewed or rotated in another direction. In general, it is observed that the long sides of one set of rectangles form an angle with the x-axis (or the y-axis), and the long sides of the other set of rectangles are at right angles to the long sides of the first set. In one embodiment, each side of the rectangles forms a 45 degree angle (or an approximately 45 degree angle, within manufacturing or design tolerances, for example) with one of the axes (the x-axis or the y-axis).

As mentioned above, in one embodiment, the interconnects of mesh 30 make electrical contact with n-wells, and the openings correspond to locations of p-wells. However, it is recognized that there may be instances in which the interconnects of mesh 30 lie across (e.g., under) locations of p-wells. Nevertheless, as mentioned above, the junctions formed where interconnects meet (e.g., junction 36) are T-shaped rather than X-shaped. In fact, according to the example of FIG. 3, all X-shaped junctions have been eliminated, in particular X-shaped junctions located in the interior portion of a conventional mesh. That is, according to embodiments of the present invention, junctions within the perimeter of the mesh are T-shaped instead of X-shaped. Thus, embodiments in accordance with the present invention reduce the probability that a junction will lie under a p-well because the area covered by a T-shaped junction is less than that of an X-shaped junction. In other words, an X-shaped junction has four (4) "arms" and hence provides 4 opportunities to cover (e.g., underlie) a p-well, while each T-shaped junction has three (3) arms and hence provides only 3 opportunities to cover a p-well. Thus, although mesh 30 provides opportunities to cover p-wells, the T-shaped junctions of mesh 30 provide an advantage over meshes having X-shaped junctions.

Figure 4:
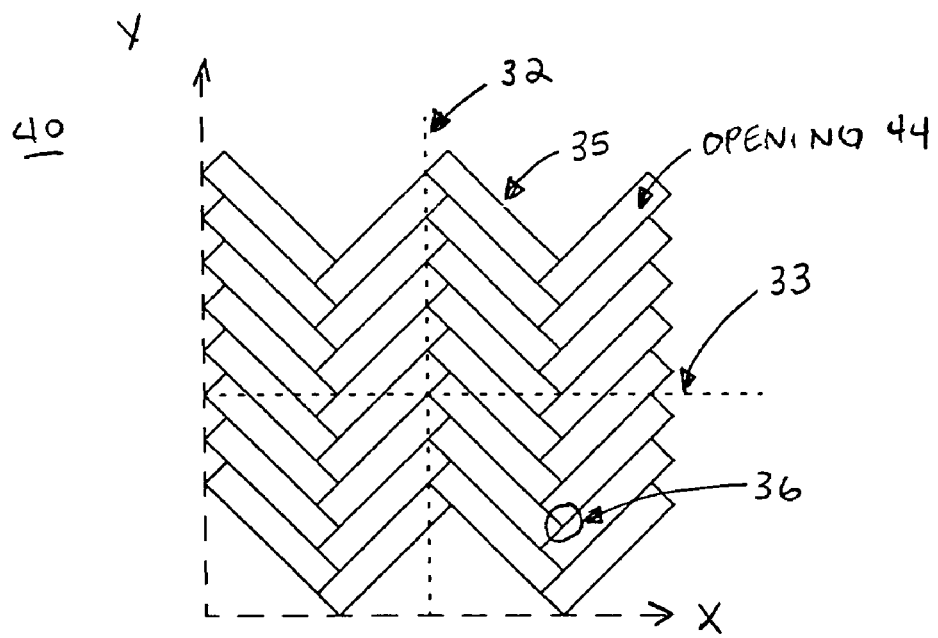

With reference now to FIG. 4, the interconnects—exemplified by interconnect 35—form a mesh 40. In mesh 40, the junctions formed where interconnects meet (exemplified by junction 36) are T-shaped.

The mesh 40 includes a number of openings, exemplified by opening 44. In one embodiment, the openings (or tiles) are rectangular in shape. In one embodiment, the length of each rectangular tile is an integer multiplier of its width, and the dimensions of the tiles are all integer multipliers of a unit of measurement.

In the example of FIG. 4, the openings (or tiles) have a uniform size. Accordingly, each pair of adjacent, parallel interconnects is separated by a uniform distance.

As can be seen by FIG. 4, relative to the x- and y-axes, some of the rectangles are skewed or rotated in one direction while other rectangles are skewed or rotated in another direction. In one embodiment, each side of the rectangles forms a 45 degree angle with one of the axes (the x-axis or the y-axis).

In one embodiment, the interconnects of mesh 40 make electrical contact with n-wells, and the openings correspond to locations of p-wells. However, there may be instances in which the interconnects of mesh 40 lie under the locations of p-wells. Nevertheless, as discussed above, the T-shaped junctions of mesh 40 provide an advantage over meshes having X-shaped junctions by reducing the probability that a junction will lie under a p-well. Relative to mesh 30 of FIG. 3, the elongated shape of the tiles further reduces the probability that a junction will underlie a p-well.

Figure 5:
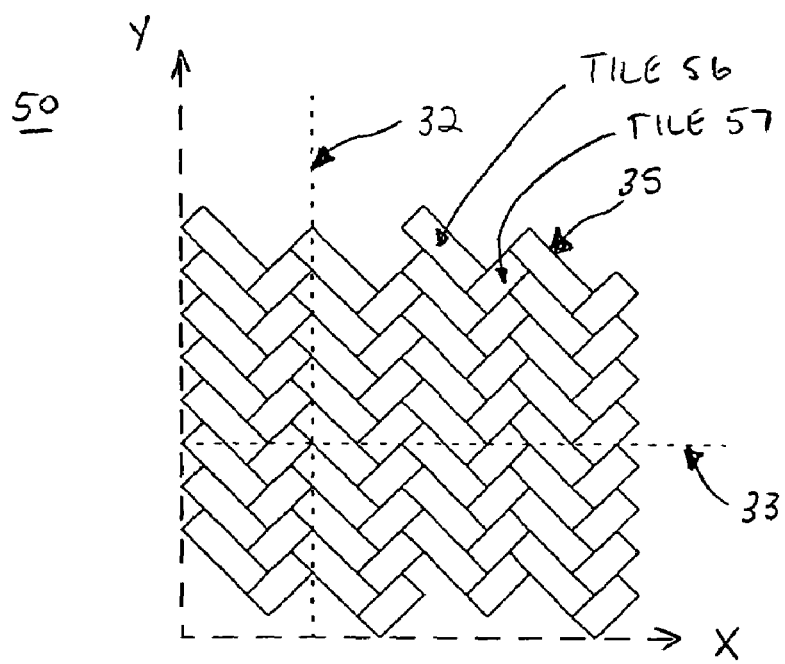

With reference next to FIG. 5, the interconnects—exemplified by interconnect 35—form a mesh 50. In mesh 50, the junctions formed where interconnects meet are T-shaped.

The mesh 50 includes a number of openings that are rectangular in shape. In the example of FIG. 5, the openings (or tiles) have different sizes. In one embodiment, there are two different sizes of rectangles, exemplified by tiles 56 and 57, respectively. In one embodiment, the length of each rectangular tile is an integer multiplier of its width, and the dimensions of the tiles are all integer multipliers of a unit of measurement. In one such embodiment, the length of tile 56 is 3 times its width, while the length of tile 57 is twice its width.

In one embodiment, each side of the rectangles forms a 45 degree angle with one of the axes (the x-axis or the y-axis). In the example of FIG. 5, each pair of adjacent, parallel interconnects is separated by one or two uniform distances.

In one embodiment, the interconnects of mesh 50 make electrical contact with n-wells, and the openings correspond to locations of p-wells. However, there may be instances in which the interconnects of mesh 50 lie under the locations of p-wells. Nevertheless, as discussed above, the T-shaped junctions of mesh 50 provide an advantage over meshes having X-shaped junctions by reducing the probability that a junction will lie under a p-well. Relative to mesh 30 of FIG. 3, the shape and arrangement of the tiles further reduces the probability that a junction will underlie a p-well.

Figure 6:
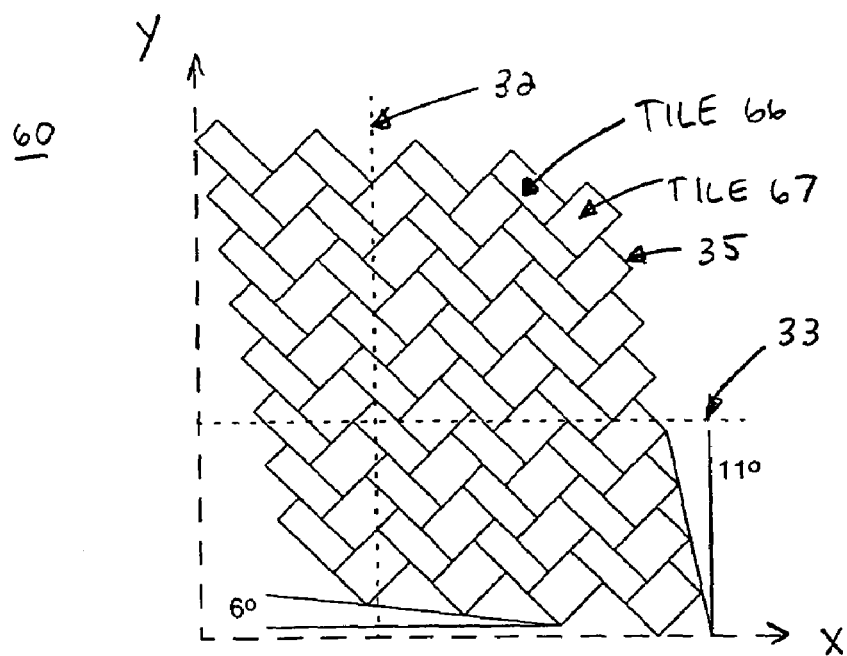

With reference now to FIG. 6, the interconnects—exemplified by interconnect 35—form a mesh 60. In mesh 60, the junctions formed where interconnects meet are T-shaped.

The mesh 60 includes a number of openings that are rectangular in shape. In the example of FIG. 6, the openings (or tiles) have different sizes. In one embodiment, there are two different sizes of rectangles, exemplified by tiles 66 and 67, respectively. In one embodiment, the dimensions of the tiles are all integer multipliers of a unit of measurement. In one such embodiment, the length of tile 66 is 4 times the unit of measurement and the width of tile 66 is 3 times the unit of measurement, and the length of tile 67 is five (5) times the unit of measurement and the width of tile 67 is twice the unit of measurement.

In one embodiment, each side of the rectangles forms a 45 degree angle with one of the axes (the x-axis or the y-axis). In the example of FIG. 6, each pair of adjacent, parallel interconnects is separated by a uniform distance.

Furthermore, because of the particular dimensions selected for the tiles, the mesh 60 is itself skewed or rotated relative to the x- and y-axes. For the tile dimensions selected, the mesh 60 forms a six degree angle with the x-axis and an 11 degree angle with the y-axis.

In one embodiment, the interconnects of mesh 60 make electrical contact with n-wells, and the openings correspond to locations of p-wells. However, there may be instances in which the interconnects of mesh 60 lie under the locations of p-wells. Nevertheless, as discussed above, the T-shaped junctions of mesh 60 provide an advantage over meshes having X-shaped junctions by reducing the probability that a junction will lie under a p-well. Relative to meshes 30, 40 and 50 (FIGS. 3, 4 and 5, respectively), the shape and arrangement of the tiles of mesh 60 further reduce the probability that a junction will underlie a p-well.

Figure 7:
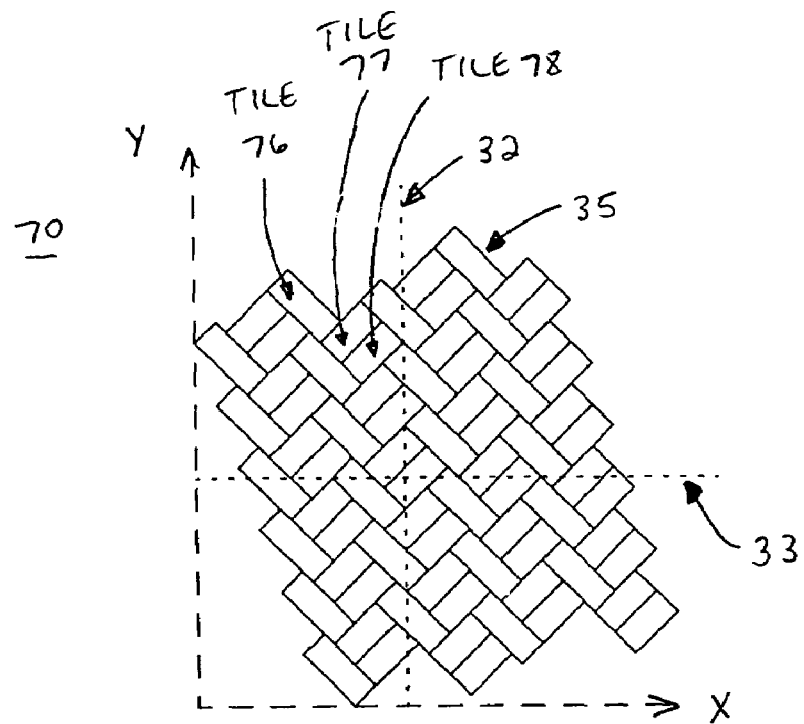

Referring now to FIG. 7, the interconnects—exemplified by interconnect 35—form a mesh 70. In mesh 70, the junctions formed where interconnects meet are T-shaped.

The mesh 70 includes a number of openings that are rectangular in shape. In the example of FIG. 7, the openings (or tiles) have different sizes. In one embodiment, there are two different sizes of rectangles. Tile 76 has one size, and tiles 77 and 78 are different in size than tile 76, although tiles 77 and 78 have the same size. In one embodiment, the dimensions of the tiles are all integer multipliers of a unit of measurement. In one such embodiment, the length of tile 76 is 5 times the unit of measurement and the width of tile 76 is twice the unit of measurement, and the length of tiles 77 and 78 is 4 times the unit of measurement and the width of tiles 77 and 78 is twice the unit of measurement.

In one embodiment, each side of the rectangles forms a 45 degree angle with one of the axes (the x-axis or the y-axis). In the example of FIG. 7, each pair of adjacent, parallel interconnects is separated by a uniform distance. Furthermore, because of the particular dimensions selected for the tiles, the mesh 70 is itself skewed or rotated relative to the x- and y-axes.

In one embodiment, the interconnects of mesh 70 make electrical contact with n-wells, and the openings correspond to locations of p-wells. However, there may be instances in which the interconnects of mesh 70 lie under the locations of p-wells. Nevertheless, as discussed above, the T-shaped junctions of mesh 70 provide an advantage over meshes having X-shaped junctions by reducing the probability that a junction will lie under a p-well. Relative to meshes 30, 40 and 50 (FIGS. 3, 4 and 5, respectively), the shape and arrangement of the tiles of mesh 70 further reduce the probability that a junction will underlie a p-well.

Figure 8:
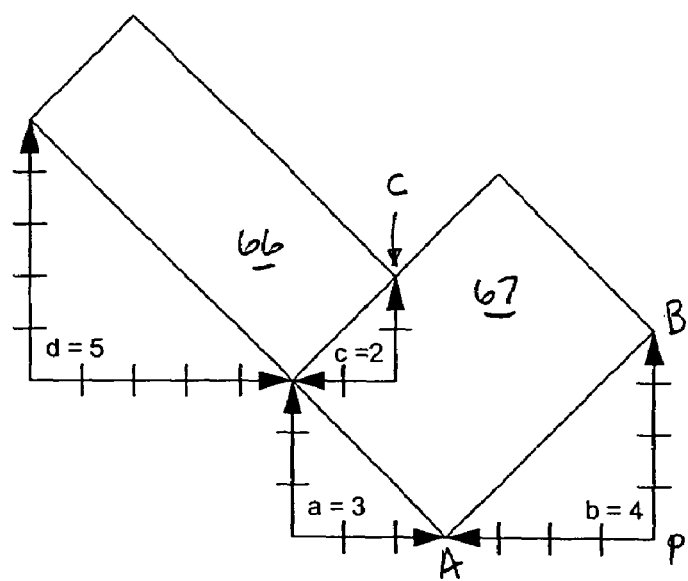
FIG. 8 illustrates elements of a pattern of interconnects in one embodiment according to the present invention.

FIG. 8 isolates tiles 66 and 67 of FIG. 6. As mentioned above, the dimensions of the tiles 66 and 67 can be expressed as integer multipliers of a unit of measurement. From another perspective, each pair of adjacent vertices of the tiles 66 and 67 is located an integer amount from a common point. For example, vertices A and B are each 4 units from a common point P. In general, this property translates to rectangles with 45 degree diagonals. Furthermore, this property provides compatibility with VLSI designs in which n-wells and p-wells are arrayed on a grid, in particular a grid in which the n-wells and p-wells are also separated by integer multipliers of a unit of measurement (though not necessarily the same unit of measurement applied to the tiles 66 and 67).

Figure 9:
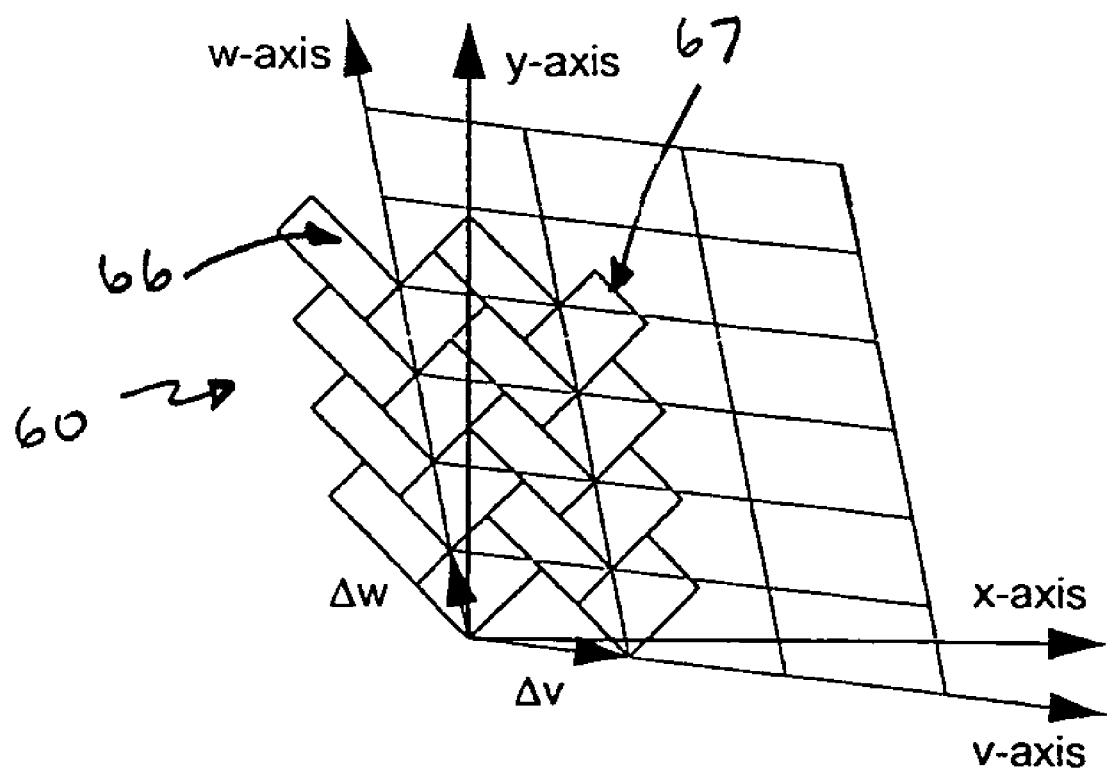
FIG. 9 illustrates the orientation of a pattern of interconnects relative to a regular grid in one embodiment according to the present invention.

FIG. 9 illustrates the orientation of mesh 60 relative to x- and y-axes in one embodiment according to the present invention. The skewed grid (the grid defined by the v- and w-axes) is defined by drawing straight lines through the points where the long sides of tiles characterized by tile 66 intersect the long sides of tiles characterized by tile 67 (point C of FIG. 8). As a result, the v-axis is not necessarily parallel to the x-axis, and the w-axis is not necessarily parallel to the y-axis.

The placement intervals Δv and Δw can be calculated as follows;

$$\Delta v = [b+d, b-d]; \text{ and}$$

$$\Delta w = [-a+c, a+c];$$

where a, b, c and d correspond to the dimensions illustrated in FIG. 8. In general, a, b, c and d are integers. An "efficient" mesh pattern (e.g., a mesh pattern in which the probability of an interconnect lying under a p-well is reduced) is achieved when, for example, a and c are not equal and where a is an integer multiplier of c, and where b and d are not equal and are "relatively prime" (relatively prime integers are integer pairs having a greatest common divisor of one). In general, an efficient mesh includes a first plurality of openings having a first dimension and a second dimension, and a second plurality of openings having a third dimension and a fourth dimension, where the first and third dimensions are measured in a same first direction and the second and fourth dimensions are measured in a same second direction, where the first dimension is an integer multiple of the third dimension and not equal, and where the second and fourth dimensions are relatively prime and not equal. The dimensions of a, b, c and d given in conjunction with FIGS. 6 and 7 satisfy these properties (in FIG. 7, a=4, b=4, c=2 and d=5, where a and b describe the combination of tiles 77 and 78). There are other dimensions that satisfy these properties. For example, the dimensions a=2, b=4, c=2 and d=3 satisfy the properties above.

With reference again to FIG. 9, the position of a tile characterized by tile 67 is given by [{−ma+nb+mc+nd}, {ma+nb+mc−nd}], and the position of a tile characterized by tile 66 is given by [{−(m+1)a+nb+mc+nd}, {(m+1)a+nb+mc−nd}], where n and m are integers.

In summary, embodiments in accordance with the present invention pertain to different types of patterns of interconnects that provide electrically conductive paths between wells (e.g., n-wells) in a semiconductor device while reducing the probability that the interconnects lie under p-wells. Mesh patterns are described that eliminate X-shaped intersections (replacing them with T-shaped intersections), and that eliminate occurrences in which the alignment of interconnects coincides entirely with the alignment of p-wells.

Embodiments in accordance with the present invention provide other advantageous features as well. The mesh patterns described are compatible with VLSI design practices. Adjacent, parallel interconnects are separated by a uniform distance, balancing sheet resistance and access to p-wells. The interconnects are themselves of uniform width.

While embodiments in accordance with the present invention have been discussed primarily in the context in which the interconnects in a mesh provide electrically conductive paths to n-wells and the openings in the mesh underlie p-wells, embodiments in accordance with the present invention are also well suited to applications in which electrically conductive paths are provided to p-wells and mesh openings underlie n-wells.

Embodiments in accordance with the present invention are thus described. While the present invention has been described in particular embodiments, it should be appreciated that the present invention should not be construed as limited by such embodiments, but rather construed according to the below claims.

What is claimed is:

1. A semiconductor device comprising:
   a plurality of wells comprising n-wells and p-wells arrayed in rows and columns that lie on a rectilinear grid; and
   a plurality of electrically conductive interconnects linking at least some of said wells, wherein said interconnects comprise a mesh having openings that are substantially rectangular in shape.

2. The semiconductor device of claim 1 wherein said openings comprise first rectangles of a first size and second rectangles of a second size.

3. The semiconductor device of claim 2 wherein the long sides of said first rectangles are at angles of 45 degrees relative to said columns and wherein the long sides of said second rectangles are at right angles to the long sides of said first rectangles.

4. The semiconductor device of claim 1 wherein said interconnects have a uniform wire width.

5. The semiconductor device of claim 1 wherein junctions between interconnects are T-shaped at locations other than locations on the perimeter of said mesh.

6. The semiconductor device of claim 1 wherein said interconnects route body bias voltages to said wells.

7. The semiconductor device of claim 1 wherein said openings correspond to connections to p-wells.

8. A semiconductor device comprising:
   a plurality of wells comprising n-wells and p-wells arrayed in rows and columns; and
   a mesh of electrically conductive interconnects linking at least some of said wells, said mesh comprising parallel first interconnects diagonal to a column and parallel second interconnects perpendicular to said first interconnects, wherein a first interconnect intersects a second interconnect to form a T-shaped junction at a location other than a location on the perimeter of said mesh.

9. The semiconductor device of claim 8 wherein said first interconnects are at angles of 45 degrees relative to said columns.

10. The semiconductor device of claim 8 wherein said first interconnects are uniformly spaced a first distance apart and wherein said second interconnects are uniformly spaced a second distance apart.

11. The semiconductor device of claim 8 wherein said interconnects have a uniform wire width.

12. The semiconductor device of claim 8 wherein openings in said mesh are rectangular in shape.

13. The semiconductor device of claim 12 wherein said openings comprise a first plurality of rectangles of a first size and a second plurality of rectangles of a second size.

14. The semiconductor device of claim 12 wherein said openings correspond to connections to said p-wells.

15. The semiconductor device of claim 8 wherein said interconnects route body bias voltages to said wells.

16. A semiconductor device comprising:
   a plurality of wells comprising n-wells and p-wells arrayed in rows and columns; and
   a plurality of electrically conductive interconnects linking at least some of said wells, said interconnects comprising a mesh comprising a first plurality of openings having a first dimension and a second dimension and a second plurality of openings having a third dimension and a fourth dimension, said first and third dimensions oriented in a same first direction and said second and fourth dimensions oriented in a same second direction, wherein said first dimension is an integer multiple of said third dimension and said first and third dimensions are not equal, and wherein said second and fourth dimensions are relatively prime and are not equal.

17. The semiconductor device of claim 16 wherein said first direction is diagonal to said columns and said second direction is orthogonal to said first direction.

18. The semiconductor device of claim 16 wherein said first direction is at an angle of 45 degrees relative to said columns.

19. The semiconductor device of claim 16 wherein said interconnects have a uniform wire width.

20. The semiconductor device of claim 16 wherein said openings correspond to connections to said p-wells.

21. The semiconductor device of claim 16 wherein said interconnects route body bias voltages to said wells.

22. The semiconductor device of claim 16 wherein junctions between interconnects are T-shaped at locations other than locations on the perimeter of said mesh.

* * * * *